(12) United States Patent
Seo et al.

(10) Patent No.: US 7,783,268 B2
(45) Date of Patent: Aug. 24, 2010

(54) TRANSMITTER AND TRANSMITTING METHOD THEREOF IN WIRELESS COMMUNICATION SYSTEM

(75) Inventors: Hae-Moon Seo, Yongin-si (KR); Yeon-Kuk Moon, Seoul (KR); Young-Kuk Park, Yongin-si (KR); Kwang-Ho Won, Yongin-si (KR); Seong-Dong Kim, Yongin-si (KR)

(73) Assignee: Korea Electronics Technology Institute (KR)

( * ) Notice: Subject to any disclaimer, the term of this patent is extended or adjusted under 35 U.S.C. 154(b) by 529 days.

(21) Appl. No.: 11/847,795

(22) Filed: Aug. 30, 2007

(65) Prior Publication Data

US 2009/0054014 A1   Feb. 26, 2009

(30) Foreign Application Priority Data

Aug. 20, 2007   (KR) .................. 10-2007-0083208

(51) Int. Cl.
*H04B 1/02* (2006.01)
*H04B 1/04* (2006.01)
*H04L 27/00* (2006.01)

(52) U.S. Cl. .................. 455/91; 455/118; 455/127.4; 375/295; 375/298

(58) Field of Classification Search ............... 455/91, 455/102, 115.1, 101, 120, 127.4, 118; 375/295, 375/297, 298
See application file for complete search history.

(56) References Cited

U.S. PATENT DOCUMENTS

| 6,633,200 | B2 | 10/2003 | Kolanek |
| 7,010,280 | B1* | 3/2006 | Wilson ..................... 455/126 |
| 7,031,676 | B2* | 4/2006 | Shi ........................... 455/126 |
| 7,260,157 | B2* | 8/2007 | Hagh et al. ................ 375/297 |
| 7,469,017 | B2* | 12/2008 | Granstrom et al. ......... 375/295 |
| 2004/0101065 | A1 | 5/2004 | Hagh et al. |

* cited by examiner

*Primary Examiner*—Sonny Trinh
(74) *Attorney, Agent, or Firm*—Edell, Shapiro & Finnan, LLC

(57) ABSTRACT

A transmitter and a transmitting method of a wireless communication system are provided. The transmitter transmits RF signals using an outphasing scheme of converting one analog IF NC-EMS into two analog C-EMSs. In the transmitter, a baseband processor generates a baseband digital modulated I-signal and a baseband digital modulated Q-signal. An IF processor up-converts the baseband digital modulated I-signal and the baseband digital modulated Q-signal to generate one digital IF NC-EMS. A signal component separator separates the digital IF NC-EMS into a first digital IF C-EMS and a second digital IF C-EMS. An RF processor up-converts the first digital IF C-EMS and the second digital IF C-EMS to generate a first analog RF C-EMS and a second analog RF C-EMS. A power amplifier amplifies powers of the first and second analog RF C-EMSs. An RF combiner combines the first and second analog RF C-EMSs having the amplified powers to generate one combined analog RF C-EMS.

15 Claims, 5 Drawing Sheets

TRANSMITTER AND TRANSMITTING METHOD THEREOF IN WIRELESS COMMUNICATION SYSTEM

CROSS-REFERENCE TO RELATED APPLICATIONS

This application claims priority under 35 U.S.C. §119 to Korean Patent Application No. 83208/2007, filed on Aug. 20, 2007, the disclosure of which is incorporated herein by reference in its entirety.

BACKGROUND OF THE INVENTION

1. Field of the Invention

The present disclosure relates to a transmitter and a transmitting method thereof in a wireless communication system, and more particularly, to a transmitter of a wireless communication system, which can transmit radio frequency (RF) signals using an outphasing scheme of converting one analog intermediate frequency non-constant envelope modulated signal (IF NC-EMS) into two analog IF C-EMSs, and a transmitting method thereof.

2. Description of the Related Art

Recently, many studies have been conducted on multi-band and low-power one-chip solutions in wireless communication systems. Because RF transmitters are essential to wireless communication systems, there is an increasing demand for optimization requirement in association with multi-band and low-power one-chip solutions.

A variety of modulation schemes are used in wireless communication systems. As a data rate is increasing, a modulation scheme becomes more complicated. To support a high data rate, most of modulation schemes store information in both amplitude and phase. In this way, such modulation schemes can increase the frequency bandwidth efficiency and the data rate. At this point, the modulated signal is a non-constant envelope modulated signal (NC-EMS). A transmitter that processes an NC-EMS requires a back-off margin of a peak-to-average ratio (PAR) higher than a transmitter that processes a constant envelope modulated signal (C-EMS). Therefore, a power amplifier having a higher linearity is needed, thus increasing the transmission power consumption of the transmitter.

Meanwhile, a super-heterodyne system is widely used as a transmission scheme in wireless communication systems. Examples of the super-heterodyne transmitter include a polar transmitter and a combined analog locked loop universal modulation (CALLUM) transmitter.

FIG. 1 is a block diagram of a conventional polar transmitter.

The conventional polar transmitter of FIG. 1 has difficulty in sorting phases/amplitudes of desired signals because of a frequency-dependant delay between an envelope and a phase. Further, the conventional polar transmitter must overcome a limited frequency response of a DC/DC converter and a limited linearity of an envelope magnitude. Moreover, a general baseband modem cannot form an entire transmission path. Thus, a polar-dedicated baseband modem must be provided for forming the entire transmission path.

FIG. 2 is a block diagram of a conventional CALLUM transmitter.

In the conventional CALLUM transmitter of FIG. 2, errors occurring in a down-conversion again appear in a final output. The hardware architecture of a feedback system is complicated and the competitiveness in high-speed broadband operation is weak.

The conventional transmitters perform a frequency up-conversion using one or more intermediate frequencies and complicated hardware is used in the conventional transmitter, thus increasing power consumption. One of approaches to solving the problems is a direct-conversion architecture that directly perform a frequency up-conversion without IF conversion.

The conventional direct-conversion, however, must generate a quadrature signal in a local oscillator. The phase of an RF signal must be accurately shifted by 90 degrees. Therefore, hardware architecture becomes more complicated and much power is consumed. Moreover, the modulation quality of the transmitter is degraded.

SUMMARY

Therefore, an object of the present invention is to provide a transmitter of a wireless communication system, which can transmit RF signals using an outphasing scheme of converting one analog IF NC-EMS into two analog IF C-EMSs, and a transmitting method thereof.

Another object of the present invention is to provide a transmitter of a wireless communication system, which can perform a high-efficiency low-power RF nonlinear amplification by transmitting RF signals using an outphasing scheme, and a transmitting method thereof.

A further object of the present invention is to provide a transmitter of a wireless communication system, which can reduce power consumption and inter-channel interference by performing a high-efficiency low-power RF nonlinear amplification, upon transmission of RF signals using an outphasing scheme, and a transmitting method thereof.

A further object of the present invention is to provide a transmitter of a wireless communication system, which can be widely applied to various communication schemes and frequency bands, without changing hardware architecture, by supporting multiple modes and multiple bands upon transmission of RF signals using an outphasing scheme, and a transmitting method thereof.

A further object of the present invention is to provide a transmitter of a wireless communication system, which can improve high-linearity and low-power characteristics and simplify hardware architecture by using a dual phase looked loop and a nonlinear power amplifier, upon transmission of RF signals using an outphasing scheme, and a transmitting method thereof.

To achieve these and other advantages and in accordance with the purpose(s) of the present invention as embodied and broadly described herein, a transmitter of a wireless communication system in accordance with an aspect of the present invention comprises: a baseband processor configured to generate a baseband digital modulated I-signal and a baseband digital modulated Q-signal; an IF processor configured to up-convert the baseband digital modulated I-signal and the baseband digital modulated Q-signal to generate one digital IF NC-EMS; a signal component separator configured to separate the digital IF NC-EMS into a first digital IF C-EMS and a second digital IF C-EMS; an RF processor configured to up-convert the first digital IF C-EMS and the second digital IF C-EMS to generate a first analog RF C-EMS and a second analog RF C-EMS; a power amplifier configured to amplify powers of the first and second analog RF C-EMSs; and an RF combiner configured to combine the first and second analog RF C-EMSs having the amplified powers to generate one combined analog RF C-EMS.

To achieve these and other advantages and in accordance with the purpose(s) of the present invention, a transmitting method of a wireless communication system in accordance with another aspect of the present invention comprises: generating a baseband digital modulated I-signal and a baseband digital modulated Q-signal; up-converting the baseband digital modulated I-signal and the baseband digital modulated Q-signal to generate one digital IF NC-EMS; separating the digital IF NC-EMS into a first digital IF C-EMS and a second digital IF C-EMS; converting the first digital IF C-EMS and the second digital IF C-EMS into a first analog IF C-EMS and a second analog IF C-EMS, and up-converting the first analog IF C-EMS and the second analog IF C-EMS to generate a first analog RF C-EMS and a second analog RF C-EMS; amplifying powers of the first and second analog RF C-EMSs; and combining the first and second analog RF C-EMSs having the amplified powers to generate one combined analog RF C-EMS.

To achieve these and other advantages and in accordance with the purpose(s) of the present invention, a transmitter of a wireless communication system in accordance with another aspect of the present invention comprises: a baseband processor configured to generate a baseband digital modulated I-signal and a baseband digital modulated Q-signal; an IF processor configured to up-convert the baseband digital modulated I-signal and the baseband digital modulated Q-signal to generate one digital IF NC-EMS; a signal component separator configured to separate the digital IF NC-EMS into a first digital IF C-EMS and a second digital IF C-EMS; a transmission controller configured to generate a transmission control signal for controlling a communication mode and a frequency band; an RF processor configured to convert the first digital IF C-EMS and the second digital IF C-EMS into a first analog IF C-EMS and a second analog IF C-EMS, and up-convert the first analog IF C-EMS and the second analog IF C-EMS to generate a first analog RF C-EMS and a second analog RF C-EMS, wherein the first analog RF C-EMS and the second analog RF C-EMS are output over the communication mode and the frequency band, which are controlled by the transmission control signal; a power amplifier configured to amplify powers of the first and second analog RF C-EMSs; and an RF combiner configured to combine the first and second analog RF C-EMSs having the amplified powers to generate one combined analog RF C-EMS.

To achieve these and other advantages and in accordance with the purpose(s) of the present invention, a transmitter of a wireless communication system in accordance with another aspect of the present invention comprises the steps of: (a) generating a baseband digital modulated I-signal and a baseband digital modulated Q-signal; (b) up-converting the baseband digital modulated I-signal and the baseband digital modulated Q-signal to generate one digital IF NC-EMS; (c) separating the digital IF NC-EMS into a first digital IF C-EMS and a second digital IF C-EMS; (d) generating a transmission control signal for controlling a communication mode and a frequency band; (e) converting the first digital IF C-EMS and the second digital IF C-EMS into a first analog IF C-EMS and a second analog IF C-EMS, up-converting the first analog IF C-EMS and the second analog IF C-EMS to generate a first analog RF C-EMS and a second analog RF C-EMS, and outputting the first analog RF C-EMS and the second analog RF C-EMS over the communication mode and the frequency band, which are controlled by the transmission control signal; (f) amplifying powers of the first and second analog RF C-EMSs; and (g) combining the first and second analog RF C-EMSs having the amplified powers to generate one combined analog RF C-EMS.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EMBODIMENTS

Hereinafter, specific embodiments will be described in detail with reference to the accompanying drawings.

Figure 1:
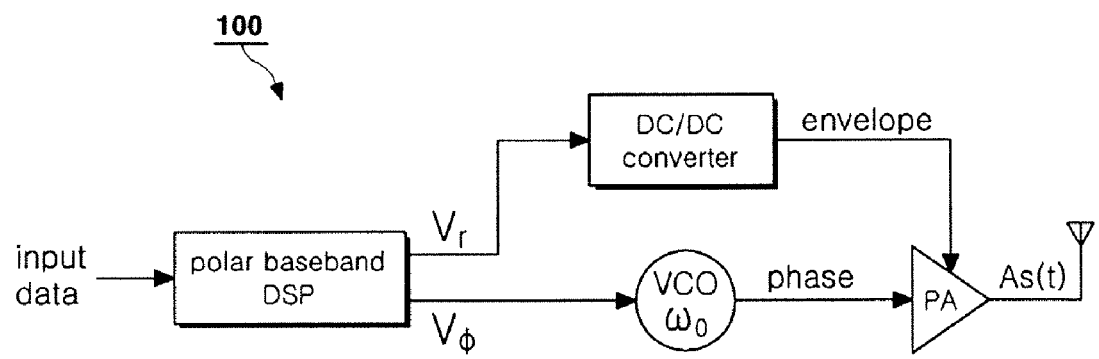
FIG. 1 is a block diagram of a conventional polar transmitter.
Figure 2:
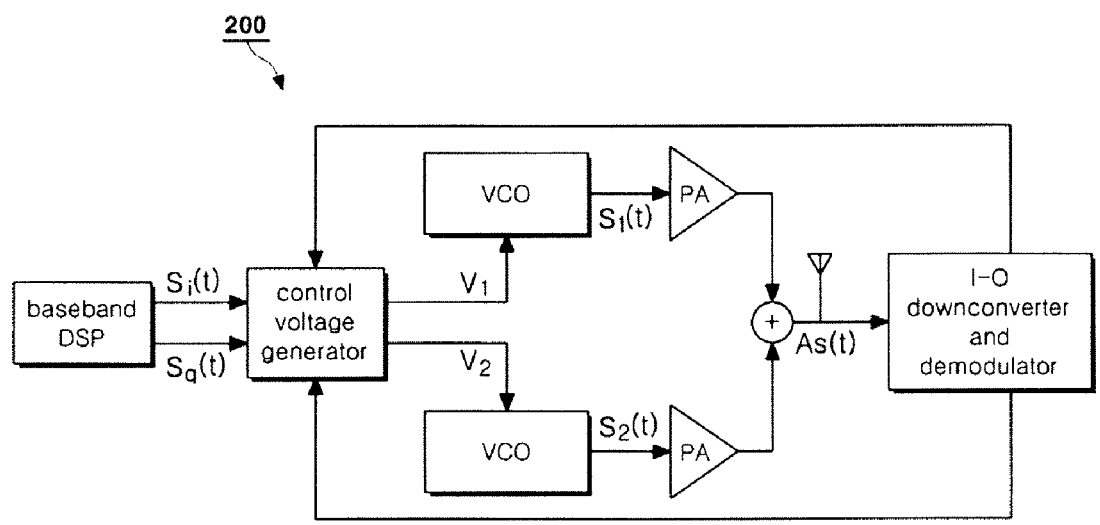
FIG. 2 is a block diagram of a conventional CALLUM transmitter.
Figure 3:
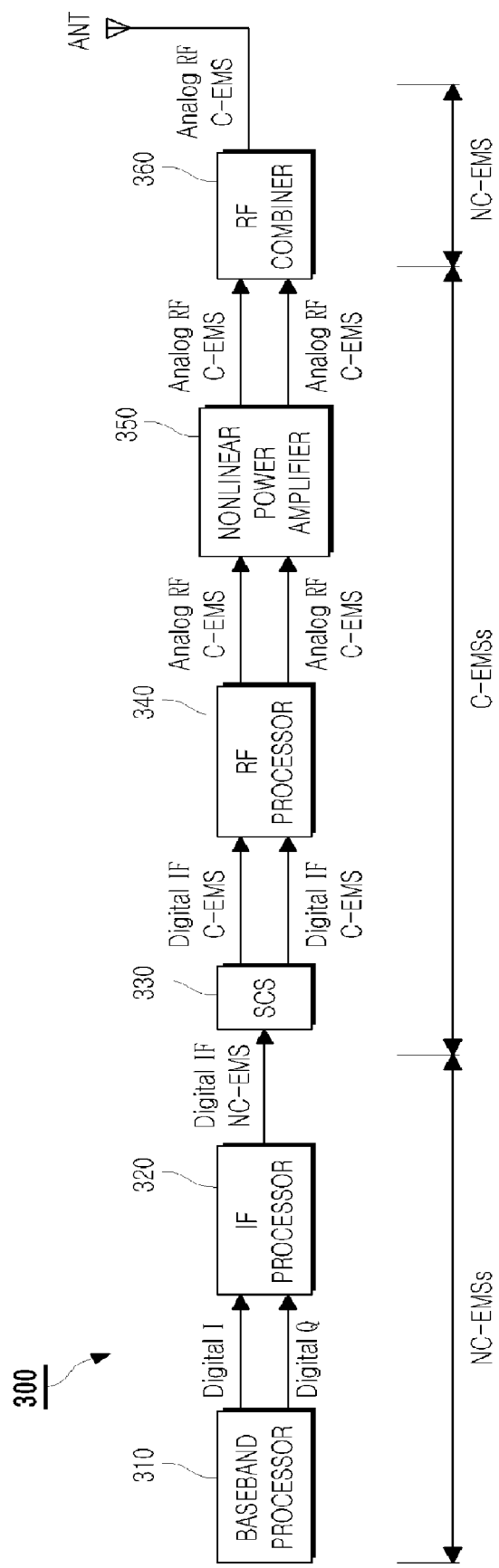
FIG. 3 is a block diagram of a transmitter of a wireless communication system according to an embodiment of the present invention.

FIG. 3 is a block diagram of a transmitter of a wireless communication system according to an embodiment of the present invention.

Referring to FIG. 3, the transmitter 300 includes a baseband processor 310, an IF processor 320, a signal component separator (SCS) 330, an RF processor 340, a nonlinear power amplifier 350, and an RF combiner 360. The baseband processor 310 generates a baseband digital modulated I-signal and a baseband digital modulated Q-signal. The IF processor 320 generates one digital IF NC-EMS using the baseband digital modulated I-signal and the baseband digital modulated Q-signal. The signal component separator 330 separates the digital IF NC-EMS into two digital IF C-EMSs. The RF processor 340 converts the two digital IF C-EMSs into two analog RF C-EMSs. The nonlinear power amplifier 350 nonlinearly amplifies powers of the two analog RF C-EMSs. The RF combiner 360 combines the two analog RF C-EMSs having the nonlinearly amplified powers to generate one combined analog RF C-EMS.

More specifically, the baseband processor 310 generates the baseband digital modulated I-signal and the baseband digital modulated Q-signal to the IF processor 320. In addition, the baseband processor 310 generates a local frequency signal to the IF processor 320. The local frequency signal will be used to convert the baseband I-signal the baseband Q-signal into the IF signals.

The IF processor 320 up-converts the baseband digital modulated I-signal from the baseband processor 310 to generate the IF digital modulated I-signal and up-converts the baseband digital modulated Q-signal from the baseband processor 310 to generate the IF digital modulated Q-signal, and mixes the IF digital modulated I-signal and the IF digital modulated Q-signal to output the digital IF NC-EMS to the signal component separator 330.

The signal component separator 330 separates the digital IF NC-EMS into the two digital IF C-EMSs using Equations (1) and (2) below:

$$NC\_EMS(t) = [NC\_EMS_i(t) + jNC\_EMS_q(t)] \times Exp(j[\omega_0 t]) \quad (1)$$
$$= R(t) \times Exp(j[\omega_0 t + \phi(t)])$$
where
$$R(t) = (NC\_EMS_i^2(t) + NC\_EMS_q^2(t))^{0.5}, \text{ and}$$
$$\phi(t) = \tan^{-1}(NC\_EMS_q(t)/NC\_EMS_i(t))$$

$$NC\_EMS(t) = C\_EMS_1(t) + C\_EMS_2(t) \quad (2)$$
where
$$C\_EMS_1(t) = 0.5 R_{max} \times Exp(j[\omega_0 t + \phi(t) + \theta(t)]),$$
$$C\_EMS_2(t) = 0.5 R_{max} \times Exp(j[\omega_0 t + \phi(t) - \theta(t)]),$$
$$\theta(t) = \cos^{-1}[R(t)/R_{max}],$$

$R_{mzs}$ represents the maximum value of $NC\_EMS(t)$, $NC\_EMS(t)$ represents the analog IF $NC\text{-}EMS$, $C\_EMS_1(t)$ represents the analog IF $C\text{-}EMS$, and Exp represents an exponential function.

In this way, the transmitter uses an outphasing scheme to convert one digital IF NC-EMS into two digital IF C-EMSs and uses the nonlinear power amplifier to perform a high-efficiency and low-power RF nonlinear amplification. Hence, power consumption of the transmitter can be reduced and inter-channel interference can be suppressed.

The RF processor 340 converts the two digital IF C-EMSs into two analog IF C-EMSs. Then, the RF processor 340 up-converts the first analog IF C-EMS into the first analog RF C-EMS and up-converts the second analog IF C-EMS into the second analog RF C-EMS.

The nonlinear power amplifier 350 nonlinearly amplifies the powers of the two up-converted analog RF C-EMSs and outputs the nonlinearly amplified analog RF C-EMSs to the RF combiner 360.

The RF combiner 360 combines the two analog RF C-EMSs having the nonlinearly amplified powers and transmits the combined analog RF C-EMS through an antenna to the outside.

Figure 4:
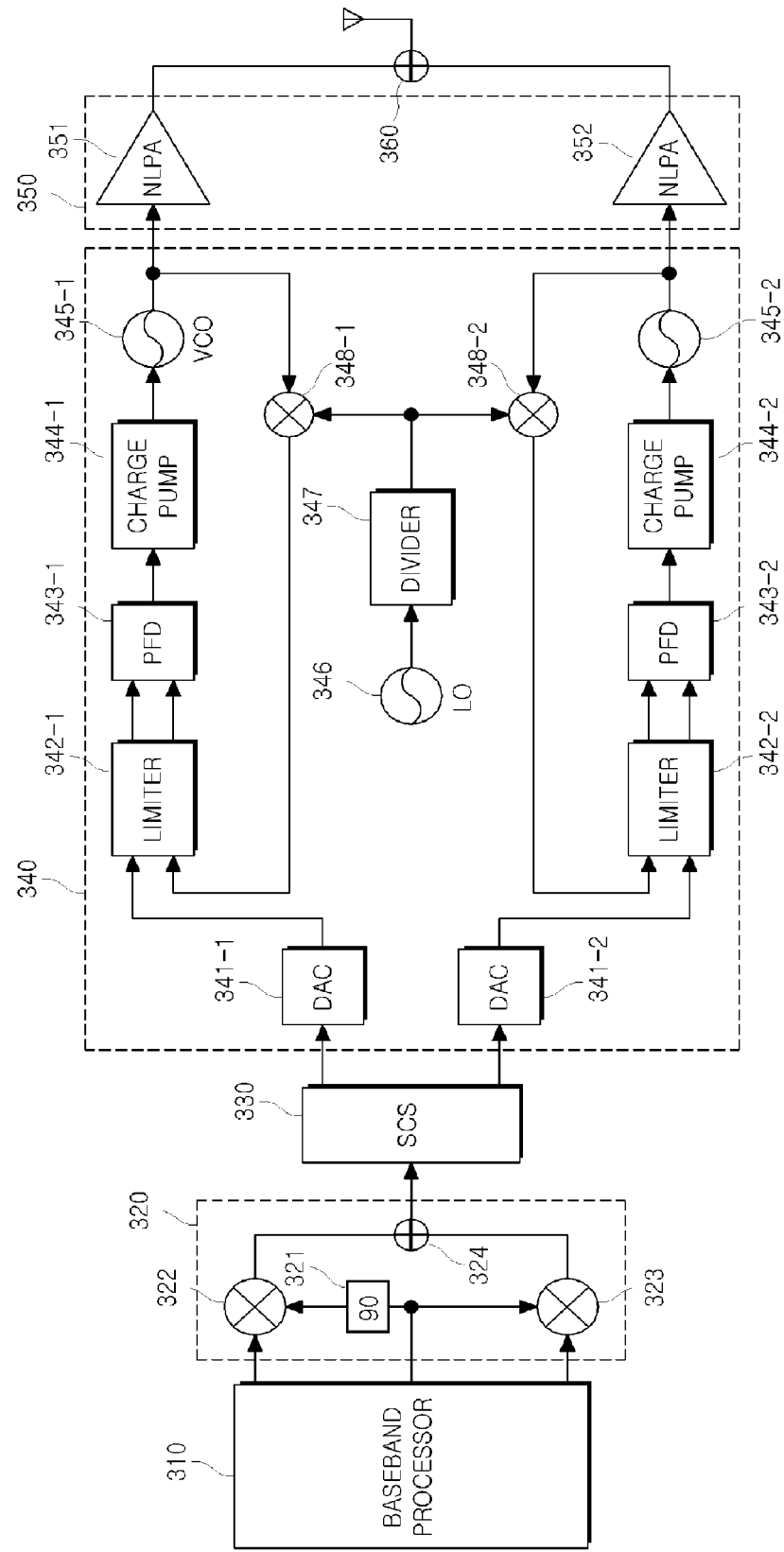
FIG. 4 is a detailed block of the transmitter illustrated in FIG. 3.

FIG. 4 is a detailed block diagram of the transmitter 300 illustrated in FIG. 3.

Referring to FIG. 4, the IF processor 320 includes a phase shifter 321, two mixers 322 and 323, and an IF combiner 324.

The phase shifter 321 shifts the phase of the local frequency signal generated from the baseband processor 310 by 90 degrees and outputs the 90-degree phase-shifted local frequency signal to the mixer 321. Although the baseband processor 310 generates the local frequency signal in this embodiment, the present invention is not limited thereto. For example, the IF processor 320 may include a local oscillator that generates the local frequency signal.

The mixer 322 mixes the 90-degree phase-shifted local frequency signal from the phase shifter 321 with the baseband digital modulated I-signal from the baseband processor 310 and outputs the IF digital modulated I-signal to the IF combiner 324.

The mixer 323 mixes the local frequency signal directly input from the baseband processor 310 with the baseband digital modulated Q-signal from the baseband processor 310 and outputs the IF digital modulated Q-signal to the IF combiner 324.

The IF combiner 324 combines the IF digital modulated I-signal from the mixer 322 and the IF digital modulated Q-signal from the mixer 323 and outputs the digital IF NC-EMS to the signal component separator 330. Because the 90-degree phase-shifted local frequency signal is input to the mixer 322, the IF digital modulated I-signal and the IF digital modulated Q-signal input to the IF combiner 324 are orthogonal to each other.

The RF processor 340 includes digital-to-analog converters (DAC) 341-1 and 341-2, limiters (LM) 342-1 and 342-2, phase frequency detectors (PFD) 343-1 and 343-2, charge pumps (CP) 344-1 and 344-2, voltage controlled oscillators (VCO) 345-1 and 345-2, a local oscillator (LO) 346, a divider 347, and mixers 348-1 and 348-2.

The DAC 341-1 converts the first digital IF C-EMS from the signal component separator 330 into the first analog IF C-EMS. The DAC 341-1 has an LPF function of filtering the first analog IF C-EMS to thereby remove unnecessary harmonics frequencies.

The limiter 342-1 compares the first analog IF C-EMS from the DAC 341-1 with an analog IF signal fed back from the mixer 348-1 and limits the amplitude of the first analog IF C-EMS. That is, the limiter 342-1 saturates the high level and the low level of the first analog IF C-EMS output from the DAC 341-1 according to the analog IF signal fed back from the mixer 348-1.

The phase frequency detector 343-1 detects the phase/frequency of the first analog IF C-EMS having the limited amplitude and outputs the detected phase/frequency to the charge pump 344-1.

The charge pump 344-1 pumps charges of the first analog IF C-EMS according to the detected phase/frequency. The charge pump 344-1 has a loop filter function of generating a DC voltage V1 proportional to the first analog RF C-EMS having the pumped charges.

The voltage controlled oscillator 345-1 generates the first analog RF C-EMS proportional to the DC voltage V1 output from the charge pump 344-1. In practice, the voltage controlled oscillator 345-1 generates the first analog RF C-EMS by up-converting the first analog IF C-EMS.

The DAC 341-2 converts the second digital IF C-EMS from the signal component separator 330 into the second analog IF C-EMS. The DAC 341-2 has an LPF function of filtering the second analog IF C-EMS to thereby remove unnecessary harmonics frequencies.

The limiter 342-2 compares the second analog IF C-EMS from the DAC 431-2 with an analog IF signal fed back from the mixer 348-2 and limits the amplitude of the second analog IF C-EMS. That is, the limiter 342-2 saturates the high level and the low level of the second analog IF C-EMS from the DAC 341-2 according to the analog IF frequency signal fed back from the mixer 348-2.

The phase frequency detector 343-2 detects the phase/frequency of the second analog IF C-EMS having the limited amplitude and outputs the detected phase/frequency to the charge pump 344-2.

The charge pump 344-2 pumps charges of the second analog IF C-EMS according to the detected phase/frequency. The charge pump 344-2 has a loop filter function of generating a DC voltage V2 proportional to the second analog IF C-EMS having the pumped charges.

The voltage controlled oscillator 345-2 generates the second analog RF C-EMS proportional to the DC voltage V2 output from the charge pump 344-2. In practice, the voltage controlled oscillator 345-2 generates the second analog RF C-EMS by up-converting the second analog IF C-EMS.

The local oscillator 346 generates a local frequency signal to the divider 347.

The divider 347 divides the local frequency signal generated from the local oscillator 346 and outputs the divided local frequency signal to the mixers 348-1 and 348-2.

The mixer 348-1 mixes the first analog RF C-EMS from the voltage controlled oscillator 345-1 with the divided local frequency signal from the divider 347 and feeds back the analog IF signal to the limiter 342-1. That is, the mixer 348-1 down-converts the first analog RF C-EMS from the voltage controlled oscillator 345-1 into the analog IF signal.

The mixer 348-2 mixes the second analog RF C-EMS from the voltage controlled oscillator 345-2 with the divided local frequency signal from the divider 347 and feeds back the analog IF signal to the limiter 342-2. That is, the mixer 348-2 down-converts the second analog RF C-EMS from the voltage controlled oscillator 345-2 into the analog IF signal.

The limiter 342-1, the phase frequency detector 343-1, the charge pump 344-1, the voltage controlled oscillator 345-1, and the mixer 348-1 constitutes a first phase locked loop (PLL), and the limiter 342-2, the phase frequency detector 343-2, the charge pump 344-2, the voltage controlled oscillator 345-2, and the mixer 348-2 constitutes a second PLL. That is, a dual PLL is used to convert the two digital IF C-EMSs into the two analog RF C-EMSs, and the phases of the signals to be up-converted are modulated.

The nonlinear power amplifier 350 includes a first nonlinear power amplifier 351 and a second nonlinear power amplifier 352.

The first nonlinear power amplifier 351 nonlinearly amplifies the power of the first analog RF C-EMS up-converted by the voltage controlled oscillator 345-1 and outputs the first analog RF C-EMS having the nonlinearly amplified power to the RF combiner 360.

The second nonlinear power amplifier 352 nonlinearly amplifies the power of the second analog RF C-EMS up-converted by the voltage controlled oscillator 345-2 and outputs the second analog RF C-EMS having the nonlinearly amplified power to the RF combiner 360.

Because the first and second nonlinear power amplifiers 351 and 352 have the high-efficiency and low-power characteristics, they perform the high-efficiency and low-power RF nonlinear amplification.

The RF combiner 360 combines the two nonlinearly low-power-amplified analog RF C-EMSs into one analog RF C-EMS.

Upon transmission of the RF signal using the outphasing scheme, the use of the dual PLL and the nonlinear power amplifiers can enhance the high-linearity and low-power characteristics and simplify the hardware architecture of the transmitter.

Figure 5:
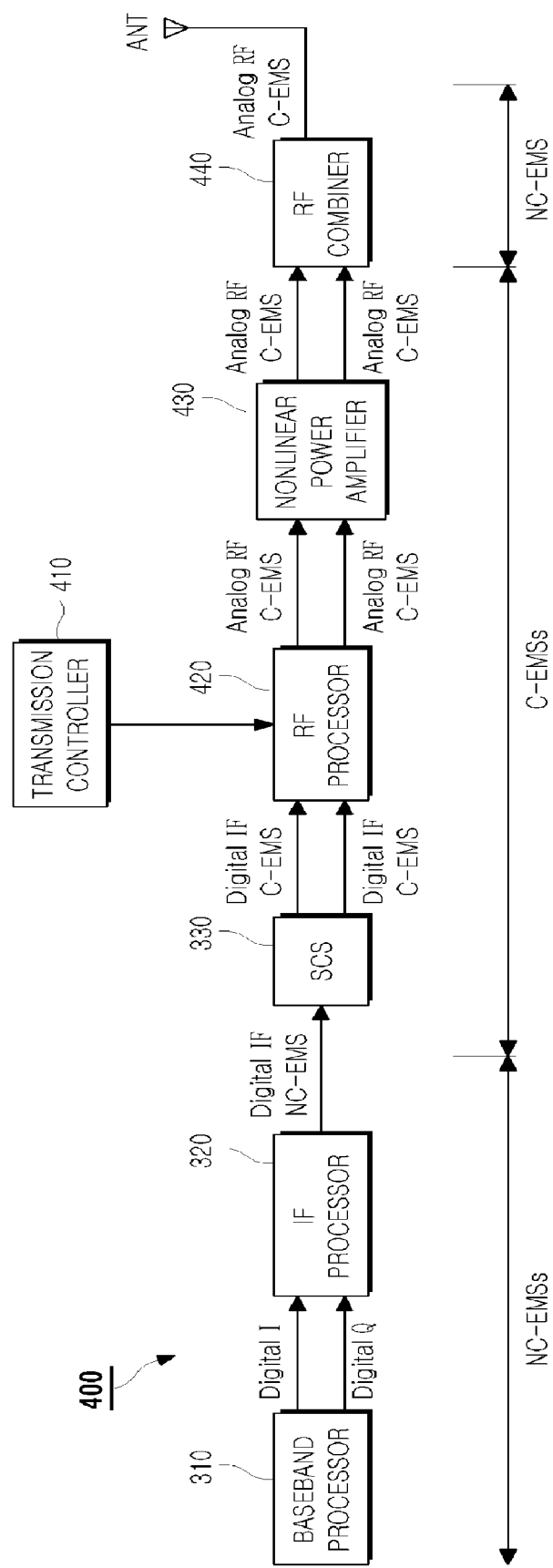
FIG. 5 is a block diagram of a transmitter of a wireless communication system according to another embodiment of the present invention.

FIG. 5 is a block diagram of a transmitter of a wireless communication system according to another embodiment of the present invention.

Referring to FIG. 5, the transmitter 400 includes a baseband processor 310, an IF processor 320, and a signal component separator 330, which are configured with the same structures as those of FIG. 3.

In addition, the transmitter 400 includes a transmission controller 410, an RF processor 420, a nonlinear power amplifier 430, and an RF combiner 440. The transmission controller 410 generates a transmission control signal TCS to the RF processor 420. The RF processor 420 converts two digital IF C-EMSs from the signal component separator 330 into two analog RF C-EMSs, and outputs the two analog RF C-EMSs over a communication mode and a frequency band controlled by the transmission control signal TCS. The nonlinear power amplifier 430 nonlinearly amplifies the powers of the two analog RF C-EMSs output from the RF processor 420. The RF combiner 440 combines the two analog RF C-EMSs having the amplified powers into one analog RF C-EMS.

When the user sets the communication mode and the frequency band, the transmission controller 410 generates the transmission control signal TCS for controlling the transmission of the RF signals over the communication mode and the frequency band. Examples of the communication mode include a code division multiple access (CDMA) and a wideband code division multiple access (WCDMA), and examples of the frequency band include a wideband and a narrowband.

The RF processor 420 converts the two digital IF C-EMSs from the signal component separator 330 into two analog IF C-EMSs, i.e., a first analog IF C-EMS and a second analog IF C-EMS. Then, the RF processor 420 up-converts the first analog IF C-EMS into a first analog RF C-EMS and up-converts the second analog IF C-EMS into a second analog RF C-EMS. The RF processor 420 generates two analog IF C-EMSs over the communication mode and the frequency band controlled by the transmission control signal TCS, and generates two analog RF C-EMSs over the communication mode and the frequency band controlled by the transmission control signal TCS.

The nonlinear power amplifier 430 nonlinearly amplifies the powers of the two up-converted analog RF C-EMSs from the RF processor 420, and outputs the nonlinearly amplified analog RF C-EMSs to the RF combiner 440. In particular, the nonlinear power amplifier 430 maintains the communication mode and the frequency band, which are processed by the RF processor 420.

The RF combiner 440 combines the two analog RF C-EMSs having the nonlinearly amplified powers and transmits the combined analog RF C-EMS through an antenna to the outside. More specifically, the RF combiner 440 transmits the combined analog RF C-EMS over the communication mode and the frequency band, which are processed by the RF processor 420.

Figure 6:
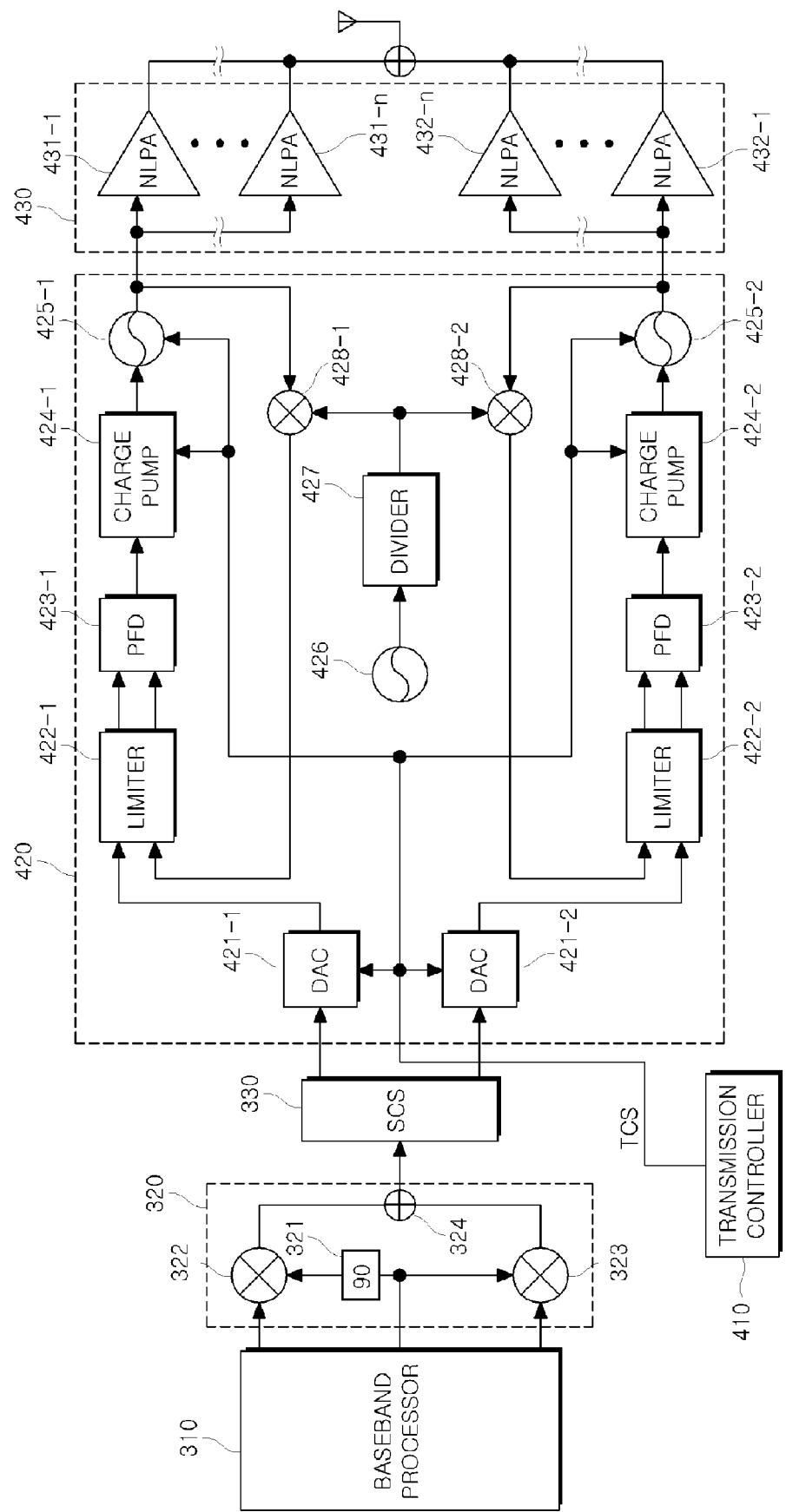
FIG. 6 is a detailed block diagram of the transmitter illustrated in FIG. 5.

FIG. 6 is a detailed block diagram of the transmitter 400 illustrated in FIG. 5.

Referring to FIG. 6, the RF processor 420 includes digital-to-analog converters (DAC) 421-1 and 421-2, limiters (LM) 422-1 and 422-2, phase frequency detectors (PFD) 423-1 and 423-2, charge pumps (CP) 424-1 and 424-2, voltage controlled oscillators (VCO) 425-1 and 425-2, a local oscillator (LO) 426, a divider 427, and mixers 428-1 and 428-2.

The DAC 421-1 converts the first digital IF C-EMS from the signal component separator 330 into the first analog IF C-EMS. The DAC 421-1 has an LPF function of filtering the first analog IF C-EMS to thereby remove unnecessary harmonics frequencies. The DAC 421-1 outputs the first analog IF C-EMS over the communication mode and the frequency band, which are controlled by the transmission control signal TCS output from the transmission controller 410.

The limiter 422-1 compares the first analog IF C-EMS from the DAC 421-1 with an analog IF signal fed back from the mixer 428-1 and limits the amplitude of the first analog IF C-EMS. That is, the limiter 422-1 saturates the high level and the low level of the first analog IF C-EMS output from the DAC 421-1 according to the analog IF signal fed back from the mixer 428-1. The limiter 422-1 outputs the limited analog IF C-EMS over the communication mode and the frequency band, which are processed by the DAC 421-1.

The phase frequency detector 423-1 detects the phase/frequency of the first analog IF C-EMS having the limited amplitude and outputs the detected phase/frequency to the charge pump 424-1.

The charge pump 424-1 pumps charges of the first analog IF C-EMS according to the detected phase/frequency. The charge pump 424-1 has a loop filter function of generating a DC voltage V1 proportional to the first analog RF C-EMS having the pumped charges. The charge pump 424-1 outputs the DC voltage V1 over the communication mode and the frequency band, which are controlled by the transmission control signal TCS output from the transmission controller 410.

The voltage controlled oscillator 425-1 generates the first analog RF C-EMS proportional to the DC voltage V1 output from the charge pump 424-1. In practice, the voltage controlled oscillator 425-1 generates the first analog RF C-EMS by up-converting the first analog IF C-EMS. The voltage controlled oscillator 425-1 outputs the first analog RF C-EMS over the communication mode and the frequency band, which are controlled by the transmission control signal TCS output from the transmission controller 410.

The DAC 421-2 converts the second digital IF C-EMS from the signal component separator 330 into the second analog IF C-EMS. The DAC 421-2 has an LPF function of filtering the second analog IF C-EMS to thereby remove unnecessary harmonics frequencies. The DAC 421-2 outputs the second analog IF C-EMS over the communication mode and the frequency band, which are controlled by the transmission control signal TCS output from the transmission controller 410.

The limiter 422-2 compares the second analog IF C-EMS from the DAC 421-2 with an analog IF signal fed back from the mixer 428-2 and limits the amplitude of the second analog IF C-EMS. That is, the limiter 422-2 saturates the high level and the low level of the second analog IF C-EMS from the DAC 421-2 according to the analog IF frequency signal fed back from the mixer 428-2. The limiter 422-2 outputs the limited analog IF C-EMS over the communication mode and the frequency band, which are processed by the DAC 421-2.

The phase frequency detector 423-2 detects the phase/frequency of the second analog IF C-EMS having the limited amplitude and outputs the detected phase/frequency to the charge pump 424-2.

The charge pump 424-2 pumps charges of the second analog IF C-EMS according to the detected phase/frequency. The charge pump 424-2 has a loop filter function of generating a DC voltage V2 proportional to the second analog IF C-EMS having the pumped charges. The charge pump 424-2 outputs the DC voltage V2 over the communication mode and the frequency band, which are controlled by the transmission control signal TCS output from the transmission controller 410.

The voltage controlled oscillator 425-2 generates the second analog RF C-EMS proportional to the DC voltage V2 output from the charge pump 424-2. In practice, the voltage controlled oscillator 425-2 generates the second analog RF C-EMS by up-converting the second analog IF C-EMS. The voltage controlled oscillator 425-2 outputs the first analog RF C-EMS over the communication mode and the frequency band, which are controlled by the transmission control signal TCS output from the transmission controller 410.

The local oscillator 426 generates a local frequency signal to the divider 427.

The divider 427 divides the local frequency signal generated from the local oscillator 426 and outputs the divided local frequency signal to the mixers 428-1 and 428-2.

The mixer 428-1 mixes the first analog RF C-EMS from the voltage controlled oscillator 425-1 with the divided local frequency signal from the divider 427 and feeds back the analog IF signal to the limiter 422-1. That is, the mixer 428-1 down-converts the first analog RF C-EMS from the voltage controlled oscillator 425-1 into the analog IF signal.

The mixer 428-2 mixes the second analog RF C-EMS from the voltage controlled oscillator 425-2 with the divided local frequency signal from the divider 427 and feeds back the analog IF signal to the limiter 422-2. That is, the mixer 428-2 down-converts the second analog RF C-EMS from the voltage controlled oscillator 425-2 into the analog IF signal.

The limiter 422-1, the phase frequency detector 423-1, the charge pump 424-1, the voltage controlled oscillator 425-1, and the mixer 428-1 constitutes a first phase locked loop (PLL), and the limiter 422-2, the phase frequency detector 423-2, the charge pump 424-2, the voltage controlled oscillator 425-2, and the mixer 428-2 constitutes a second PLL. That is, a dual PLL is used to convert the two digital IF C-EMSs into the two analog RF C-EMSs, and modulate the phases of the signals to be up-converted. The dual PLL outputs the signals over the communication mode and the frequency band, which are controlled by the transmission control signal TCS output from the transmission controller 410.

The nonlinear power amplifier 430 includes a plurality of first nonlinear power amplifiers 431-1 to **431-*n* and a plurality of second nonlinear power amplifiers 432-1 to 432-*n*. The first nonlinear power amplifiers 431-1 to 431-*n* nonlinearly amplify the power of the first analog RF C-EMS output from the voltage controlled oscillator 425-1, and the second nonlinear power amplifiers 432-1 to 432-*n* nonlinearly amplify the power of the second analog RF C-EMS output from the voltage controlled oscillator 425-2**.

Because the first nonlinear power amplifiers 431-1 to **431-*n* and the second nonlinear power amplifiers 432-1 to 432-*n* have the high-efficiency and low-power characteristics, they perform the high-efficiency and low-power RF nonlinear amplification. The RF combiner 440** combines the nonlinearly low-power-amplified analog RF C-EMSs into one analog RF C-EMS.

Upon transmission of the RF signal using the outphasing scheme, the use of the dual PLL and the nonlinear power amplifiers can enhance the high-linearity and low-power characteristics and simplify the hardware architecture of the transmitter.

According to the embodiments of the present invention, the transmitter can perform the high-efficiency low-power RF nonlinear amplification by transmitting RF signals using the outphasing scheme.

Further, the transmitter can reduce power consumption and inter-channel interference by performing the high-efficiency low-power RF nonlinear amplification, upon transmission of RF signals using the outphasing scheme.

Furthermore, the transmitter can be widely applied to various communication schemes and frequency bands, without changing hardware architecture, by supporting multiple modes and multiple bands upon transmission of RF signals using the outphasing scheme.

Furthermore, the transmitter can improve high-linearity and low-power characteristics and simplify hardware architecture by using the dual PLL and the nonlinear power amplifier, upon transmission of RF signals using the outphasing scheme.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A transmitter of a wireless communication system, comprising:
   a baseband processor configured to generate a baseband digital modulated I-signal and a baseband digital modulated Q-signal;
   an intermediate frequency (IF) processor configured to up-convert the baseband digital modulated I-signal and the baseband digital modulated Q-signal to generate one digital IF non-constant envelope modulated signal (NC-EMS);
   a signal component separator configured to separate the digital IF NC-EMS into a first digital IF C-EMS and a second digital IF C-EMS;
   a radio frequency (RF) processor configured to up-convert the first digital IF C-EMS and the second digital IF C-EMS to generate a first analog RF C-EMS and a second analog RF C-EMS;
   a power amplifier configured to amplify powers of the first and second analog RF C-EMSs; and
   an RF combiner configured to combine the first and second analog RF C-EMSs having the amplified powers to generate one combined analog RF C-EMS.

2. The transmitter of claim 1, wherein the signal component separator separates the digital IF NC-EMS into the first digital IF C-EMS and the second digital IF C-EMS using Equations below:

$$NC\_EMS(t) = [NC\_EMS_i(t) + jNC\_EMS_q(t)] \times \text{Exp}(j[\omega_0 t]) \quad (1)$$
$$= R(t) \times \text{Exp}(j[\omega_0 t + \phi(t)])$$

where
$$R(t) = (NC\_EMS_i^2(t) + NC\_EMS_q^2(t))^{0.5}, \text{ and}$$
$$\phi(t) = \tan^{-1}(NC\_EMS_q(t)/NC\_EMS_i(t),$$

$$NC\_EMS(t) = C\_EMS_1(t) + C\_EMS_2(t) \quad (2)$$

where
$$C\_EMS_1(t) = 0.5 R_{\max} \times \text{Exp}(j[\omega_0 t + \phi(t) + \theta(t)]),$$
$$C\_EMS_2(t) = 0.5 R_{\max} \times \text{Exp}(j[\omega_0 t + \phi(t) - \theta(t)]),$$
$$\theta(t) = \cos^{-1}[R(t)/R_{\max}],$$

$R_{mzs}$ represents the maximum value of $NC\_EMS(t)$, $NC\_EMS(t)$ represents the analog IF $NC$-$EMS$, $C\_EMS_1(t)$ represents the analog IF $C$-$EMS$, and Exp represents an exponential function.

3. The transmitter of claim 1 or 2, wherein the power amplifier comprises:
   a first nonlinear power amplifier configured to nonlinearly amplify the power of the first analog RF C-EMS; and
   a second nonlinear power amplifier configured to nonlinearly amplify the power of the second analog RF C-EMS.

4. A transmitting method of a wireless communication system, comprising:
   generating a baseband digital modulated I-signal and a baseband digital modulated Q-signal;
   up-converting the baseband digital modulated I-signal and the baseband digital modulated Q-signal to generate one digital intermediate frequency non-constant envelope modulated signal (IF NC-EMS);
   separating the digital IF NC-EMS into a first digital IF C-EMS and a second digital IF C-EMS;
   converting the first digital IF C-EMS and the second digital IF C-EMS into a first analog IF C-EMS and a second analog IF C-EMS, and up-converting the first analog IF C-EMS and the second analog IF C-EMS to generate a first analog RF C-EMS and a second analog RF C-EMS;
   amplifying powers of the first and second analog RF C-EMSs; and
   combining the first and second analog RF C-EMSs having the amplified powers to generate one combined analog RF C-EMS.

5. The transmitting method of claim 4, wherein the powers of the first and second analog RF C-EMSs are nonlinearly amplified.

6. A transmitter of a wireless communication system, comprising:
   a baseband processor configured to generate a baseband digital modulated I-signal and a baseband digital modulated Q-signal;
   an intermediate frequency (IF) processor configured to up-convert the baseband digital modulated I-signal and the baseband digital modulated Q-signal to generate one digital IF non-constant envelope modulated signal (NC-EMS);
   a signal component separator configured to separate the digital IF NC-EMS into a first digital IF C-EMS and a second digital IF C-EMS;
   a transmission controller configured to generate a transmission control signal for controlling a communication mode and a frequency band;
   a radio frequency (RF) processor configured to convert the first digital IF C-EMS and the second digital IF C-EMS into a first analog IF C-EMS and a second analog IF C-EMS, and up-convert the first analog IF C-EMS and the second analog IF C-EMS to generate a first analog RF C-EMS and a second analog RF C-EMS, wherein the first analog RF C-EMS and the second analog RF C-EMS are output over the communication mode and the frequency band, which are controlled by the transmission control signal;
   a power amplifier configured to amplify powers of the first and second analog RF C-EMSs; and
   an RF combiner configured to combine the first and second analog RF C-EMSs having the amplified powers to generate one combined analog RF C-EMS.

7. The transmitter of claim 6, wherein the RF processor comprises:
   a first digital-to-analog converter configured to convert the first digital IF C-EMS into the first analog IF C-EMS, and output the first analog IF C-EMS over the communication mode and the frequency band, which are controlled by the transmission control signal;
   a second digital-to-analog converter configured to convert the second digital IF C-EMS into the second analog IF C-EMS, and output the second analog IF C-EMS over the communication mode and the frequency band, which are controlled by the transmission control signal;
   a local oscillator configured to generate a local frequency signal;
   a divider configured to divide the local frequency signal;
   a first phase locked loop configured to up-convert the first analog IF C-EMS using the divided local frequency signal to generate the first analog RF C-EMS, and output the first analog RF C-EMS over the communication mode and the frequency band, which are controlled by the communication control signal; and
   a second phase locked loop configured to up-convert the second analog IF C-EMS using the divided local frequency signal to generate the second analog RF C-EMS, and output the second analog RF C-EMS over the communication mode and the frequency band, which are controlled by the communication control signal.

8. The transmitter of claim 7, wherein the first phase locked loop comprises:
a first mixer configured to down-convert the first analog RF C-EMS using the divided local frequency signal to generate a first analog IF signal;
a first limiter configured to compare the first analog IF C-EMS from the first digital-to-analog converter with the first analog IF signal and limit the amplitude of the first analog IF C-EMS;
a first phase frequency detector configured to detect a phase/frequency of the first analog IF C-EMS limited by the first limiter;
a first charge pump configured to pump charges of the first analog IF C-EMS according to the detected phase/frequency to generate a first DC voltage proportional to the first analog IF C-EMS; and
a first voltage controlled oscillator configured to generate the first analog RF C-EMS proportional to the first DC voltage, and output the first analog RF C-EMS over the communication mode and the frequency band, which are controlled by the transmission control signal.

9. The transmitter of claim 7, wherein the second phase locked loop comprises:
a second mixer configured to down-convert the second analog RF C-EMS using the divided local frequency signal to generate a first analog IF signal;
a second limiter configured to compare the second analog IF C-EMS from the second digital-to-analog converter with the second analog IF signal and limit the amplitude of the second analog IF C-EMS;
a second phase frequency detector configured to detect a phase/frequency of the second analog IF C-EMS limited by the second limiter;
a second charge pump configured to pump charges of the second analog IF C-EMS according to the detected phase/frequency to generate a second DC voltage proportional to the second analog IF C-EMS; and
a second voltage controlled oscillator configured to generate the second analog RF C-EMS proportional to the second DC voltage, and output the second analog RF C-EMS over the communication mode and the frequency band, which are controlled by the transmission control signal.

10. The transmitter of any one of claims 6 through 9, wherein the power amplifier comprises:
a plurality of first nonlinear power amplifiers configured to nonlinearly amplify the power of the first analog RF C-EMS; and
a plurality of second nonlinear power amplifiers configured to nonlinearly amplify the power of the second analog RF C-EMS.

11. A transmitting method of a wireless communication system, comprising the steps of:
(a) generating a baseband digital modulated I-signal and a baseband digital modulated Q-signal;
(b) up-converting the baseband digital modulated I-signal and the baseband digital modulated Q-signal to generate one digital IF NC-EMS;
(c) separating the digital IF NC-EMS into a first digital IF C-EMS and a second digital IF C-EMS;
(d) generating a transmission control signal for controlling a communication mode and a frequency band;
(e) converting the first digital IF C-EMS and the second digital IF C-EMS into a first analog IF C-EMS and a second analog IF C-EMS, up-converting the first analog IF C-EMS and the second analog IF C-EMS to generate a first analog RF C-EMS and a second analog RF C-EMS, and outputting the first analog RF C-EMS and the second analog RF C-EMS over the communication mode and the frequency band, which are controlled by the transmission control signal;
(f) amplifying powers of the first and second analog RF C-EMSs; and
(g) combining the first and second analog RF C-EMSs having the amplified powers to generate one combined analog RF C-EMS.

12. The transmitting method of claim 11, wherein the step (e) comprises:
(e1) converting the first digital IF C-EMS into the first analog IF C-EMS, and outputting the first analog IF C-EMS over the communication mode and the frequency band, which are controlled by the transmission control signal;
(e2) converting the second digital IF C-EMS into the second analog IF C-EMS, and outputting the second analog IF C-EMS over the communication mode and the frequency band, which are controlled by the transmission control signal;
(e3) generating a local frequency signal;
(e4) dividing the local frequency signal;
(e5) up-converting the first analog IF C-EMS using the divided local frequency signal to generate the first analog RF C-EMS, and outputting the first analog RF C-EMS over the communication mode and the frequency band, which are controlled by the communication control signal; and
(e6) up-converting the second analog IF C-EMS using the divided local frequency signal to generate the second analog RF C-EMS, and outputting the second analog RF C-EMS over the communication mode and the frequency band, which are controlled by the communication control signal.

13. The transmitting method of claim 12, wherein the step (e5) comprises:
(e5-1) down-converting the first analog RF C-EMS using the divided local frequency signal to generate a first analog IF signal;
(e5-2) comparing the first analog IF C-EMS with the first analog IF signal, and limiting the amplitude of the first analog IF C-EMS;
(e5-3) detecting a phase/frequency of the limited first analog IF C-EMS;
(e5-4) pumping charges of the first analog IF C-EMS according to the detected phase/frequency to generate a first DC voltage proportional to the first analog IF C-EMS; and
(e5-5) generating the first analog RF C-EMS proportional to the first DC voltage, and outputting the first analog RF C-EMS over the communication mode and the frequency band, which are controlled by the transmission control signal.

14. The transmitting method of claim 12, wherein the step (e6) comprises:
(e6-1) down-converting the second analog RF C-EMS using the divided local frequency signal to generate a first analog IF signal;
(e6-2) comparing the second analog IF C-EMS with the second analog IF signal, and limiting the amplitude of the second analog IF C-EMS;
(e6-3) detecting a phase/frequency of the limited second analog IF C-EMS;

(e6-4) pumping charges of the second analog IF C-EMS according to the detected phase/frequency to generate a second DC voltage proportional to the second analog IF C-EMS; and (e6-5) generating the second analog RF C-EMS proportional to the second DC voltage, and outputting the second analog RF C-EMS over the communication mode and the frequency band, which are controlled by the transmission control signal.

15. The transmitting method of any one of claims 11 to 14, wherein the step (g) comprises nonlinearly amplifying the powers of the first and second analog RF C-EMSs.

* * * * *